United States Patent
Hübner et al.

(10) Patent No.: US 11,302,927 B2
(45) Date of Patent: Apr. 12, 2022

(54) METHOD FOR PRODUCING A NOBLE METAL-FREE CATALYST, A NOBLE METAL-FREE CATALYST, A FUEL CELL AND A MOTOR VEHICLE

(71) Applicants: AUDI AG, Ingolstadt (DE); Volkswagen AG, Wolfsburg (DE)

(72) Inventors: Gerold Hübner, Braunschweig (DE); Lasse Schmidt, Wolfsburg (DE); Alexander Vollbrecht, Braunschweig (DE)

(73) Assignees: VOLKSWAGEN AG, Wolfsburg (DE); AUDI AG, Ingolstadt (DE)

( * ) Notice: Subject to any disclaimer, the term of this patent is extended or adjusted under 35 U.S.C. 154(b) by 0 days.

(21) Appl. No.: 17/272,114

(22) PCT Filed: Jul. 9, 2019

(86) PCT No.: PCT/EP2019/068325
§ 371 (c)(1),
(2) Date: Feb. 26, 2021

(87) PCT Pub. No.: WO2020/043373
PCT Pub. Date: Jun. 5, 2020

(65) Prior Publication Data
US 2021/0320304 A1  Oct. 14, 2021

(30) Foreign Application Priority Data

Aug. 27, 2018  (DE) .................... 10 2018 214 403.6

(51) Int. Cl.
*H01M 4/88* (2006.01)
*C23C 16/40* (2006.01)
(Continued)

(52) U.S. Cl.
CPC ......... *H01M 4/8878* (2013.01); *C23C 16/403* (2013.01); *C23C 16/405* (2013.01);
(Continued)

(58) Field of Classification Search
CPC .. H01M 4/9083; H01M 4/926; H01M 4/9008; H01M 4/90; C23C 16/4417; C23C 16/45525
(Continued)

(56) References Cited

U.S. PATENT DOCUMENTS

2014/0261646 A1  9/2014 Hoertz et al.
2016/0240860 A1* 8/2016 Strasser ............... B01J 23/8892
(Continued)

FOREIGN PATENT DOCUMENTS

CN      107275653 A    10/2017
DE  10 2016 203 936     9/2017
(Continued)

OTHER PUBLICATIONS

Banham, Dustin et al.; "A review of the stability and durability of non-precious metal catalysts for the oxygen reduction reaction in proton exchange membrane fuel cells"; *Journal of Power Sources*; 2015, vol. 285; pp. 334-348.
(Continued)

*Primary Examiner* — Tabassom Tadayyon Eslami
(74) *Attorney, Agent, or Firm* — Seed IP Law Group LLP

(57) ABSTRACT

A method for producing a noble metal-free catalyst comprises providing a catalyst support comprising organic heterocycles as catalyst, and applying an oxidation-inhibiting protective layer. Embodiments further relate to a noble metal-free catalyst, a fuel cell, and a motor vehicle.

4 Claims, 1 Drawing Sheet

(51) Int. Cl.
*C23C 16/455* (2006.01)
*H01M 4/90* (2006.01)
*H01M 4/92* (2006.01)

(52) U.S. Cl.
CPC ...... *C23C 16/407* (2013.01); *C23C 16/45525* (2013.01); *H01M 4/9008* (2013.01); *H01M 4/9083* (2013.01); *H01M 4/926* (2013.01); *H01M 2250/20* (2013.01)

(58) Field of Classification Search
USPC .............................. 427/226, 227, 228, 115
See application file for complete search history.

(56) References Cited

U.S. PATENT DOCUMENTS

| | | |
|---|---|---|
| 2017/0098829 A1 | 4/2017 | Zelenay et al. |
| 2018/0185791 A1 | 7/2018 | Kamik et al. |
| 2020/0298221 A1* | 9/2020 | Oh .................... H01M 4/8892 |

FOREIGN PATENT DOCUMENTS

| | | |
|---|---|---|
| JP | 2010-67509 A | 3/2010 |
| WO | 2014/181498 | 11/2014 |

OTHER PUBLICATIONS

Cheng, Niancai et al.; "Electrocatalysts by atomic layer deposition for fuel cell applications"; *Nano Energy*; 2016; pp. 1-24.

Kaneto, Keiichi et al.; "Characterization of Catalytic Conducting Polymer Electrodes in Biofuel Devices"; *Materials Research Society*; 2018, vol. 3; p. 1235-1241.

Liu, Gang et al.; "Development of non-precious metal oxygen-reduction catalysts for PEM fuel cells based on N-doped ordered porous carbon"; *Applied Catalysis B: Environmental*; 2009, vol. 93; pp. 156-165.

Wang, Ying et al.; "Ammonia Gas Sensor Using Polypyrrole-Coated $TiO_2$/ZnO Nanofibers" *Electroanalysis*; 2009, vol. 21 No, 12; pp. 1432-1438.

* cited by examiner

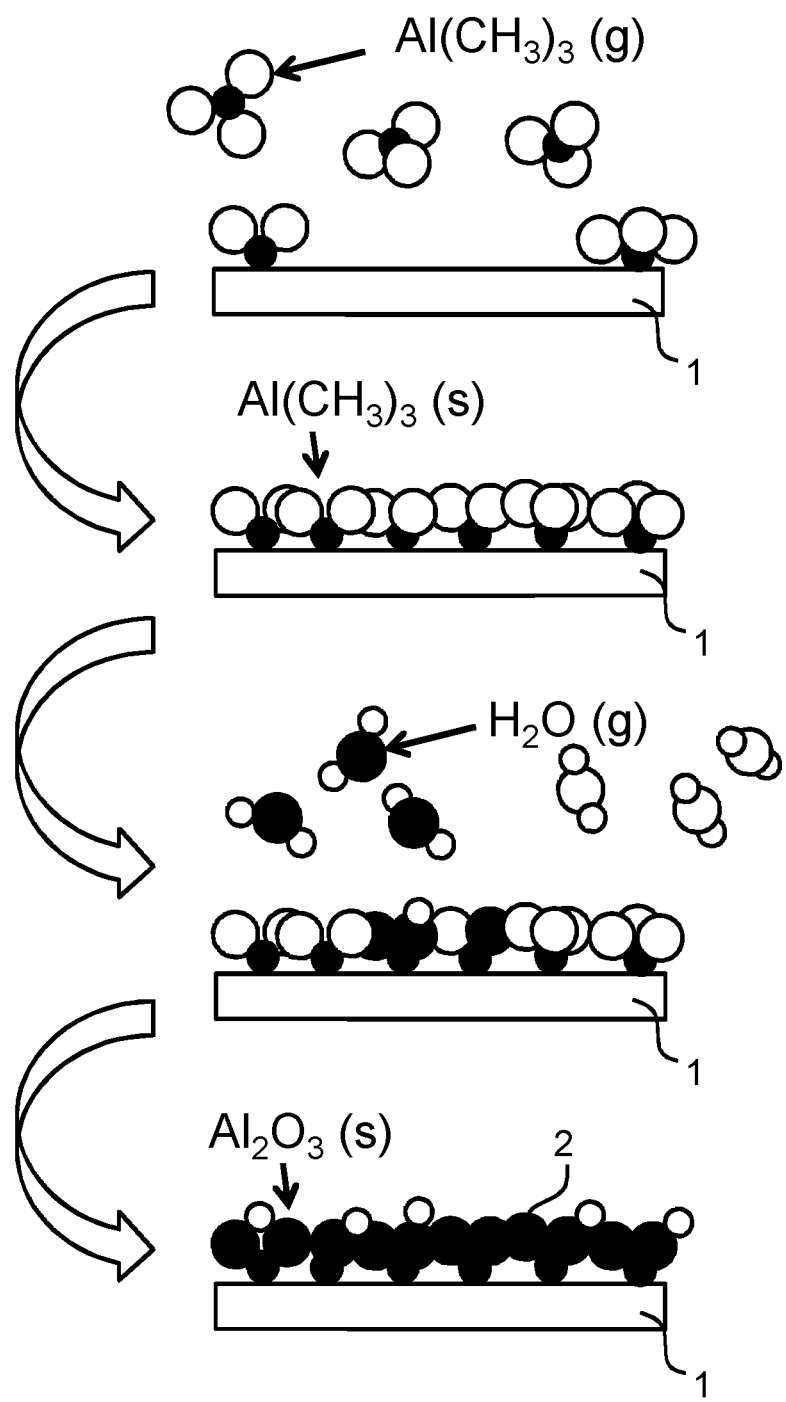

METHOD FOR PRODUCING A NOBLE METAL-FREE CATALYST, A NOBLE METAL-FREE CATALYST, A FUEL CELL AND A MOTOR VEHICLE

BACKGROUND

Technical Field

Embodiments of the invention relate to a method for producing a noble metal-free catalyst, a noble metal-free catalyst, a fuel cell and a motor vehicle with a fuel cell.

Description of the Related Art

Fuel cells are becoming more and more widespread and are being optimized in particular with regard to their suitability for use in motor vehicles. Fuel cells are used to provide electrical energy by means of an electrochemical reaction, with which an electric motor can be operated. This electrochemical reaction between a fuel, as a rule hydrogen, and an oxygen-containing gas, as a rule air, requires a catalyst, which is usually formed by noble metals such as platinum or palladium. However, in the case of the majority of fuel cells that are combined into a fuel cell stack, noble metals worth several thousand euros are required for the operational needs of a motor vehicle. In order to reduce the cost of a fuel cell, efforts are therefore being made to provide noble metal-free catalysts, i.e., catalysts formed without the use of platinum, palladium, ruthenium, iridium, osmium, rhenium, rhodium, gold or their alloys. However, noble metal-free catalysts that are based on metal complexes, for example iron porphyrins, are shown to have a limited service life and in some cases lose up to 50 percent of their power within a few hours of operation.

The application of a protective layer is proposed in JP 2010067509 A to improve the stability of a conductive support for the noble metal-free metal oxide catalyst such as $Al_2O_3$. In US 2017/0098829 A1 now abandoned, a method for producing a noble metal-free catalyst is proposed, in which the catalyst support has a protective layer of $TiO_2$, $Al_2O_3$.

BRIEF SUMMARY

Embodiments of the invention provide a method for producing a noble metal-free catalyst whose service life is extended while maintaining the same performance. Other embodiments provide an improved noble metal-free catalyst, an improved fuel cell, as well as an improved motor vehicle.

In the search for alternatives to noble metal-free catalysts, in particular anode catalysts, based on metal complexes, organic heterocycles formed by pyrolysis of porphyrin complex compounds, in particular metal complexes of Fe, Co, Mn with polypyrroles or polyanilines, as described in US 2016/0240860A now abandoned, were also investigated. However, these showed a high degradation, so that within 40 hours of operation, performance drops of up to 50% were observed. Oxidative degradation of the organic heterocycles, as well as of the catalyst supports in such noble metal-free catalysts known from the prior art, proved to be problematic. It is proposed to apply an oxidation-inhibiting protective layer to the carbon or alternatively organic support. In so doing, it should be noted that pyrolysis does not affect the protective layer, whereby the protective layer is particularly ensured if the protective layer is applied only after pyrolysis. This protective layer is thereby formed by a material selected from a group comprising $Al_2O_3$, $TiO_2$ and $SnO_2$, wherein the protective layer is applied with a layer thickness which is between 1 nm and 50 nm. In this, it is shown that the activity of the catalyst complex is also not affected with the concrete existing catalysts, and this both during constant potentiostatic operation and under unfavorable operating parameters, e.g., under start-stop conditions. It is possible to apply the protective layer by atomic layer deposition. Alternatively, it is also possible to use a physical deposition method to apply the protective layer, e.g., a plasma method. In principle, this layer can be applied to the catalyst particles before they are processed into a CCM (catalyst coated membrane) or applied to a CCM after the catalyst paste has been applied to a membrane or alternatively a catalyst support or a GDL (gas diffusion layer).

In addition, it is also possible for the catalyst support to be formed by a carbon support which is already stabilized before the application of the noble metal-free catalyst, in such a way that a coating of the carbon support can be applied before application of the catalyst, and a subsequent coating of the carbon support is also possible after the catalyst has been applied. Stabilization of the carbon support can be achieved by (partial) graphitization and/or by coating using $Al_2O_3$, $TiO_2$, $SnO_2$.

A noble metal-free catalyst formed according to these aforementioned method steps is characterized by significantly reduced costs in the manufacture of a fuel cell, as well as by an extended service life, which is clearly superior to the noble metal-free catalyst with metal heterocycles. This noble metal-free catalyst can be used in particular in a fuel cell, in a direct relationship with the membrane in a membrane electrode assembly or as a component of a gas diffusion electrode. The cost advantages in the manufacture of such a fuel cell are particularly apparent when several fuel cells are combined to form a fuel cell stack. Cost advantages also result when used in motor vehicles.

BRIEF DESCRIPTION OF THE SEVERAL VIEWS OF THE DRAWINGS

Further advantages, features, and details are provided in the claims, the following description, and the drawings.

FIG. 1 is a schematic representation of the application of an oxidation-inhibiting protective layer of $Al_2O_3$ to a catalyst support comprising organic heterocycles as catalyst.

DETAILED DESCRIPTION

FIG. 1 schematically shows a catalyst support 1 formed by a carbon support and carrying organic heterocycles as a noble metal-free catalyst. In this, an oxidation-inhibiting protective layer 2 is applied by means of atomic layer deposition, which in the embodiment example shown is formed by $Al_2O_3$, alternatively, other oxidation-inhibiting protective layers 2 are also possible such as: $TiO_2$, $SnO_2$. The protective layer 2 is applied with a layer thickness that is between 1 nm and 50 nm, so that this oxidation-inhibiting protective layer 2 results in protection against oxidative attack both from the organic heterocycles and the catalyst support 1.

Alternatively, it is also possible that a physical deposition method such as a plasma method is used to apply the protective layer 2.

As an alternative, there is also the possibility of stabilizing the catalyst support 1 formed by a carbon support prior to the application of the noble metal-free catalyst, namely by graphitization or by a coating with $Al_2O_3$ and/or $TiO_2$ and/or $SnO_2$.

This method provides a noble metal-free catalyst which has a significant cost advantage over noble metal-containing catalysts and a significantly extended service life compared to other noble metal-free catalysts, so that its use is particularly suitable in fuel cells and these in turn in motor vehicles.

In general, in the following claims, the terms used should not be construed to limit the claims to the specific embodiments disclosed in the specification and the claims, but should be construed to include all possible embodiments along with the full scope of equivalents to which such claims are entitled.

The invention claimed is:

1. A method for producing a catalyst free of noble metal, comprising;
   providing a catalyst support comprising organic heterocycles; and
   applying an oxidation-inhibiting protective layer to the catalyst support, wherein the protective layer is formed of a material selected from a group consisting of $Al_2O_3$, $TiO_2$, and $SnO_2$, and wherein the protective layer is applied with atomic layer deposition.

2. The method according to claim 1, wherein the protective layer is applied with a layer thickness between 1 nm and 50 nm.

3. The method according to claim 1, wherein the catalyst support is formed by a carbon support which is stabilized before application of the catalyst.

4. The method according to claim 3, wherein stabilization is carried out by graphitization and/or by coating with $Al_2O_3$, $TiO_2$ or $SnO_2$.

* * * * *